United States Patent [19]
Noda

[11] Patent Number: 5,138,417
[45] Date of Patent: Aug. 11, 1992

[54] HIGH-FREQUENCY SEMICONDUCTOR DEVICE
[75] Inventor: Noboru Noda, Kawasaki, Japan
[73] Assignee: Kabushiki Kaisha Toshiba, Kawasaki, Japan
[21] Appl. No.: 645,413
[22] Filed: Jan. 24, 1991
[30] Foreign Application Priority Data
  Jan. 25, 1990 [JP] Japan .................................. 2-13528
[51] Int. Cl.$^5$ ..................... H01L 29/72; H01L 23/48; H01L 27/02
[52] U.S. Cl. ....................................... 357/34; 357/36; 357/68; 357/51
[58] Field of Search ....................... 357/34, 36, 68, 51, 357/59

Primary Examiner—Mark V. Prenty
Attorney, Agent, or Firm—Finnegan, Henderson, Farabow, Garrett and Dunner

[57] ABSTRACT

In a light-frequency transistor a base electrode extends from at lease two portions of a transistor region toward the outside, and the extension portions are connected to each other. Thus, a margin of a current density of a base electrode is not decreased. Moreover, the base electrode extends from at least two portions of the transistor region, and at least one of the two extension portions extends on a resistor layer connected to an emitter electrode and is connected to the other extension portion. For this reason, a collector electrode, the emitter electrode, and the base electrode can be formed at the same time, and a pattern for the base electrode can be easily obtained.

13 Claims, 9 Drawing Sheets

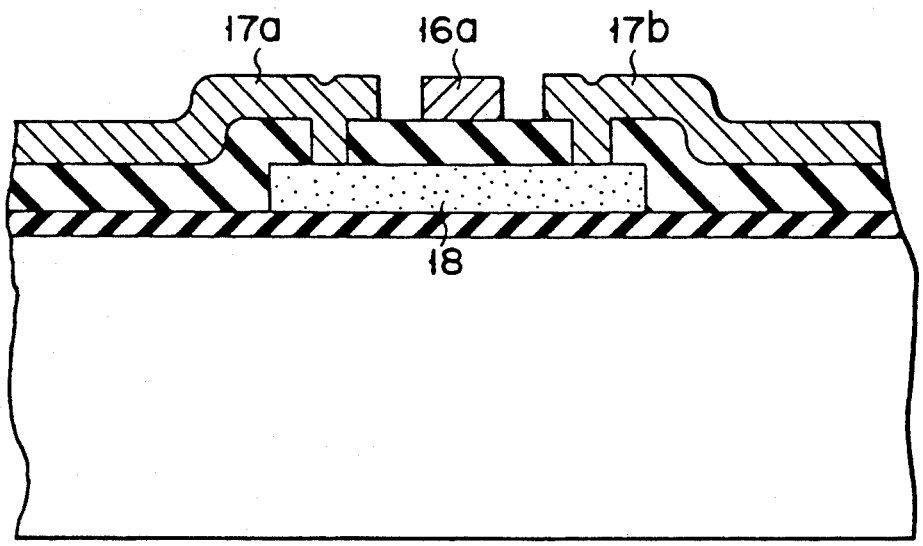
F I G. 5
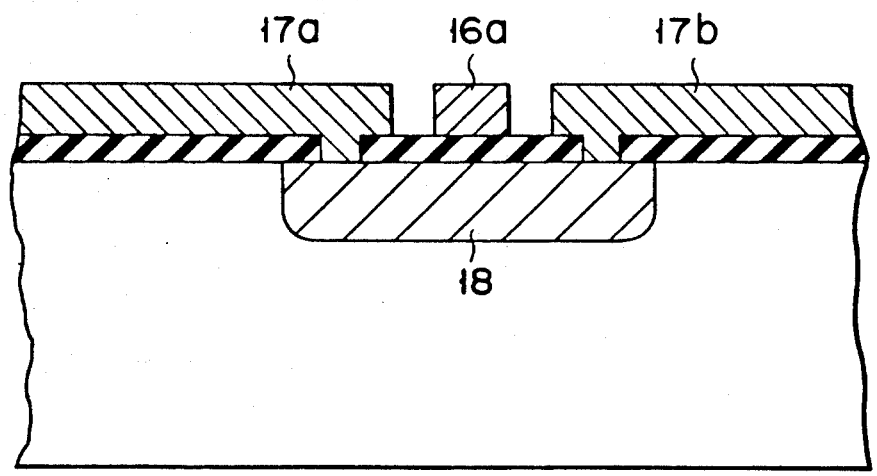
F I G. 6

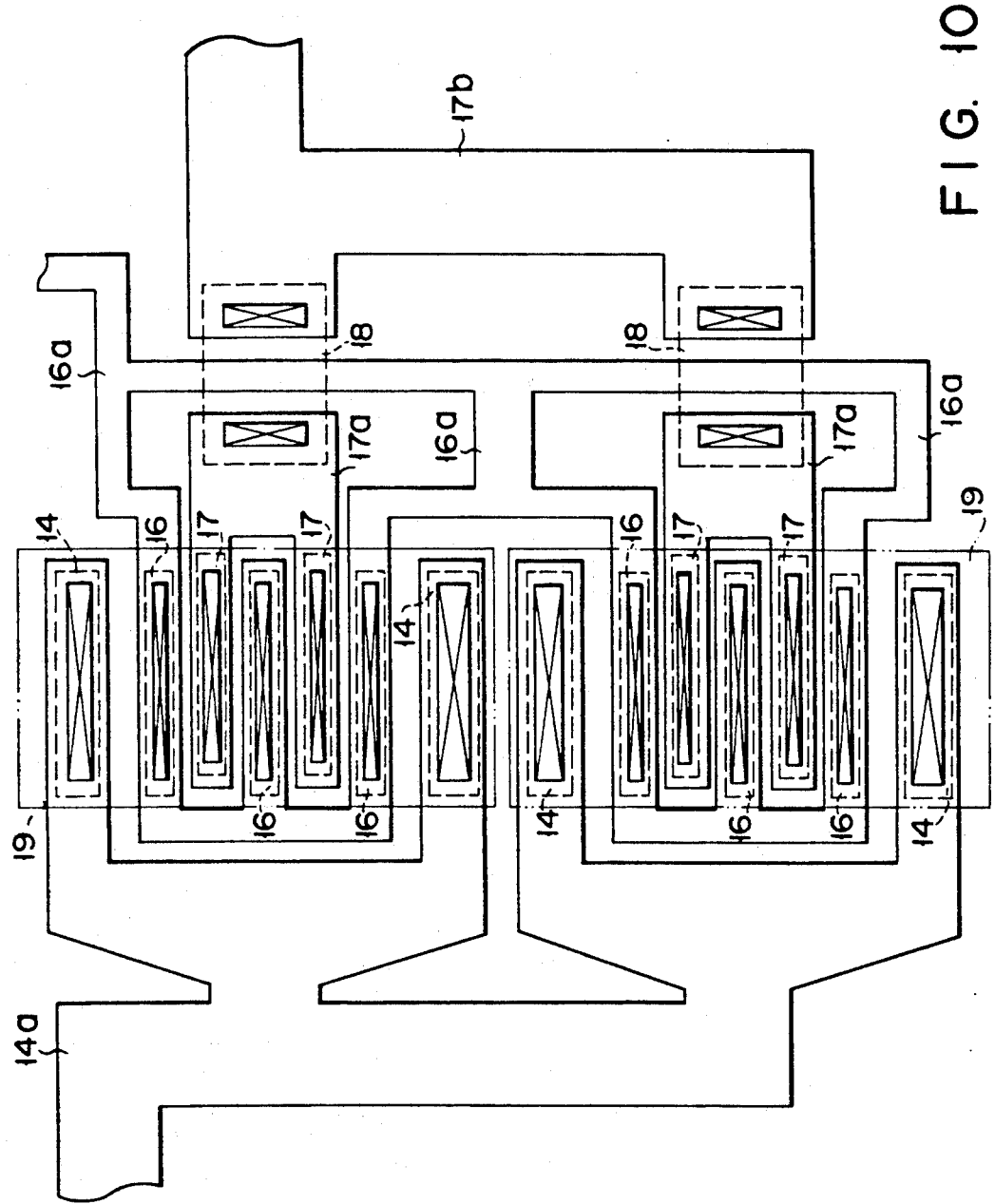

HIGH-FREQUENCY SEMICONDUCTOR DEVICE

BACKGROUND OF THE INVENTION

1. Field of the Invention

The present invention relates to a high-frequency semiconductor device, i.e., a high-frequency transistor, in which collector, emitter, and base electrodes are formed on a major surface of a substrate and, more particularly, to a high-frequency semiconductor device incorporated in an IC chip and used in a wide-band amplifier.

2. Description of the Related Art

Conventionally, a high-frequency transistor in which collector, emitter, and base electrodes are formed on a major surface of a substrate has a schematic two-dimensional pattern shown in FIG. 1. FIG. 2 is a sectional view showing the high-frequency transistor along a line II—II in FIG. 1. Referring to FIG. 2, reference numeral 1 denotes a p-type semiconductor substrate; 2, an $n^+$-type buried collector layer; 3, an n-type collector layer; 4, an $n^+$-type collector extraction layer; 4a, a collector electrode; 5, a p-type base layer; 6, a $p^+$-type base layer; 6a, a base electrode; 7, an $n^+$-type emitter layer; 7a, an emitter electrode; 8, a thin film resistor; and 9, a transistor region.

The $n^+$-type buried collector layer 2 is formed in the transistor region 9. The $n^+$-type collector extraction layer 4 (continuous layer) reaching the major surface of the substrate is formed at both the ends of the $n^+$-type buried collector layer 2. The p-type base layer 5 is formed in a surface region of the n-type collector layer 3 defined by the $n^+$-type buried collector layer 2 and the $n^+$-type collector extraction layer 4, and the $p^+$-type base layers 6 and the $n^+$-type emitter layers 7 are alternately formed one by one in the surface region of the base layer 5. The collector electrode (continuous layer) 4a is formed on the $n^+$-type collector extraction layer 4. The base electrode (continuous layer) 6a is formed on the $p^+$-type base layer 6. The emitter electrode (continuous layer) 7a is formed on the $n^+$-type emitter layer 7. The emitter electrode 7a is connected to an external emitter electrode 7b through the emitter resistor 8 consisting of a thin film resistor.

The base electrode 6a extends from only one end of the transistor region 9 in relation to the pattern of an electrode layer and a wiring layer. The collector electrode 4a extends from both ends of the transistor region 9.

Because the base electrode 6a extends from only one end of the transistor region 9, the collector current is increased to increase a transition frequency, i.e., improve high-frequency characteristics, the base resistance is increased, and the transistor has poor stability. That is, in order to increase the transition frequency, a pitch between the $p^+$-type base layer 6 and the $n^+$-type emitter layer 7 must be decreased. When the pitch between the $p^+$-type base layer 6 and the $n^+$-type emitter layer 7 is decreased, the capacity therebetween is decreased, thereby improving high-frequency characteristics. However, since electrode widths of the base electrode 6a and the emitter electrode 7a are also decreased, the current density of a current flowing through these electrodes is increased. As the result, a collector current is increased, and the base resistance is increased. Therefore, the circuit operation becomes unstable. In order to solve the above problem, a decrease in high-frequency output and a decrease in high-frequency gain must be considered.

As described above, in the conventional semiconductor device, since a base electrode extends from only one end of a transistor region, as the collector current is increased, the base resistance is increased, and the operation becomes unstable. In order to solve the above problem, high-frequency output and high-frequency gain is necessarily decreased.

SUMMARY OF THE INVENTION

It is, therefore, an object of the present invention to provide a semiconductor device capable of increasing a high-frequency output and a high-frequency gain and increasing a margin of a current density of a base electrode such that a base of a transistor region is stably driven.

According to the present invention, there is provided a semiconductor device comprising a transistor region in a semiconductor substrate, a collector region and a base region formed in the transistor region, a plurality of emitter regions and a plurality of high-concentration base regions alternately in the base region, a base electrode on the plurality of high-concentration base regions extending from at least two portions of the transistor region, and extension portions connected to each other.

According to the present invention, there is provided a semiconductor device further comprising a collector electrode on the collector region extending from at least two portions of the transistor region on one side, and extension portions connected to each other, and an emitter electrode including an emitter electrode portion on a predetermined number of emitter regions of the plurality of emitter regions as a continuous layer and extending from the transistor region on a side opposite to the side where the collector region extends, and another emitter electrode portion on another predetermined number of emitter regions of the plurality of emitter regions as a continuous layer and extending from the transistor region on the opposite side, and with the extension portions of both the emitter electrode portions connected to each other.

According to the present invention, there is provided a semiconductor device further comprising a collector electrode on the collector region and extending from at least two portions of the transistor region on one side, and extension portions of which are connected to each other, and emitter electrodes which are independently formed in the plurality of emitter regions and extend from the transistor region on a side opposite to the side where the collector region extends, and extension portions of which are connected to each other.

According to the above arrangement, a base electrode extends from at lease two portions of a transistor region, and the extension portions are connected to each other. A margin of a current density of a base electrode is not decreased.

In addition, the base electrode extends from at lease two portions of the transistor region, and at least one of the two extension portions extends on a resistor layer connected to an emitter electrode and is connected to the other extension portion. For this reason, a collector electrode, the emitter electrode, and the base electrode can be formed at the same time, and a pattern for the base electrode can be easily obtained.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 5 and 6 are sectional views showing the semiconductor device along a line V—V in FIG. 3;

FIG. 10 is a plan view showing a pattern of a semiconductor device according to the fourth embodiment of the present invention.

DETAILED DESCRIPTION OF THE PREFERRED EMBODIMENTS

Figure 1:
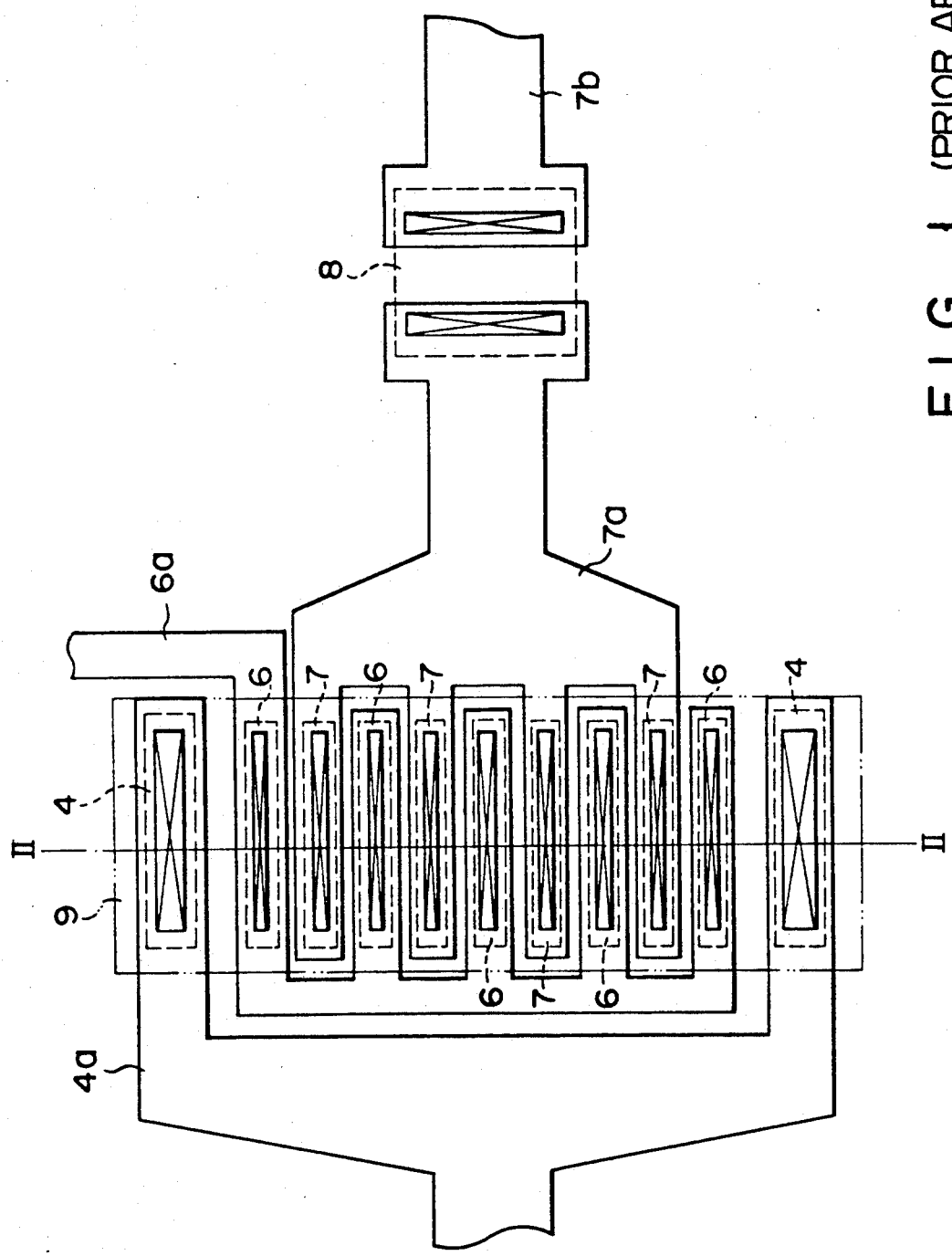
FIG. 1 is a schematic plan view showing a pattern of a conventional semiconductor device.
Figure 2:
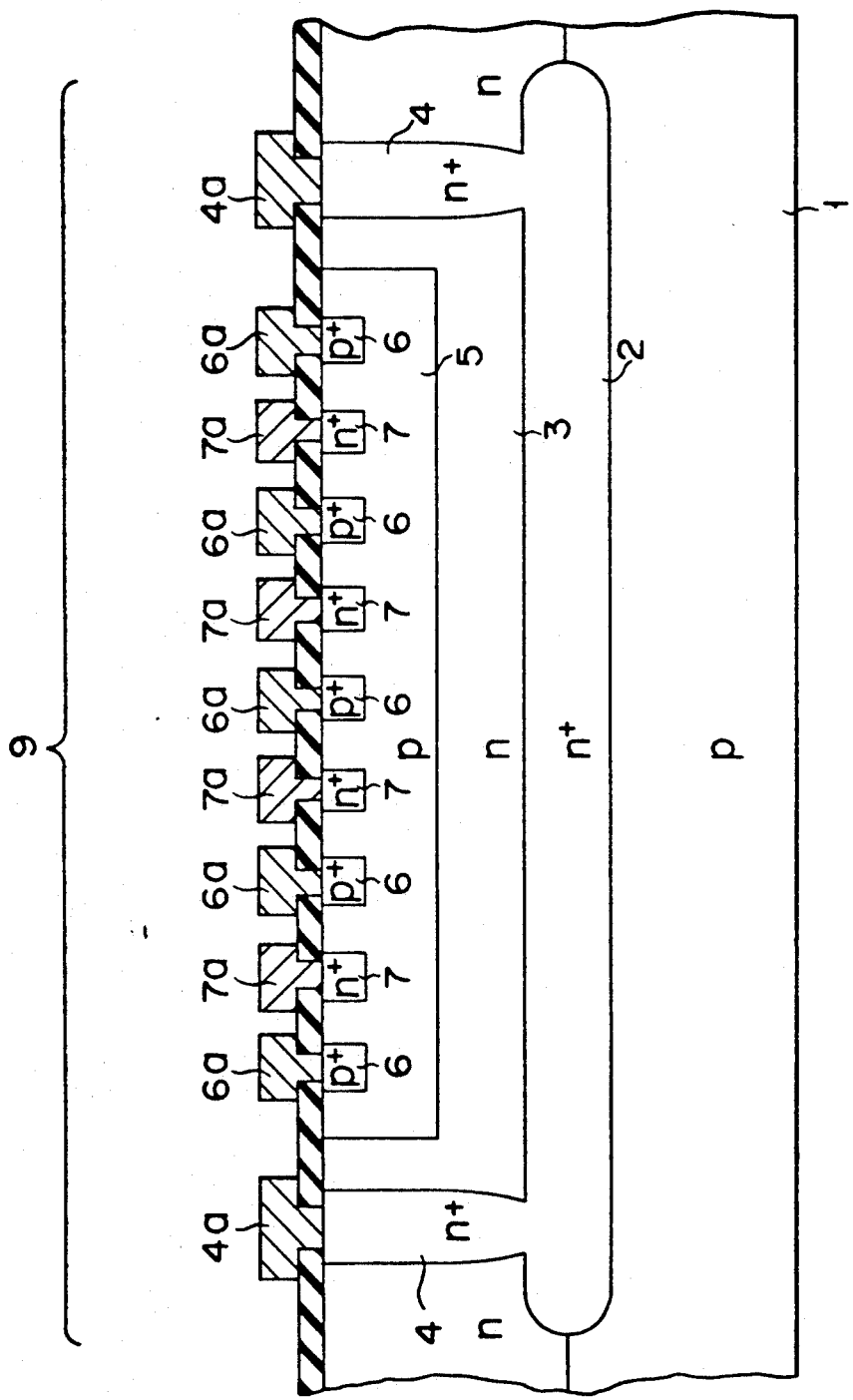
FIG. 2 is a sectional view showing the semiconductor device along a line II—II in FIG. 1.

An embodiment of the present invention will be described below with reference to the accompanying drawings. In this description, common reference numerals denote common parts throughout all the drawings, and descriptive repetitions will be omitted.

Figure 3:
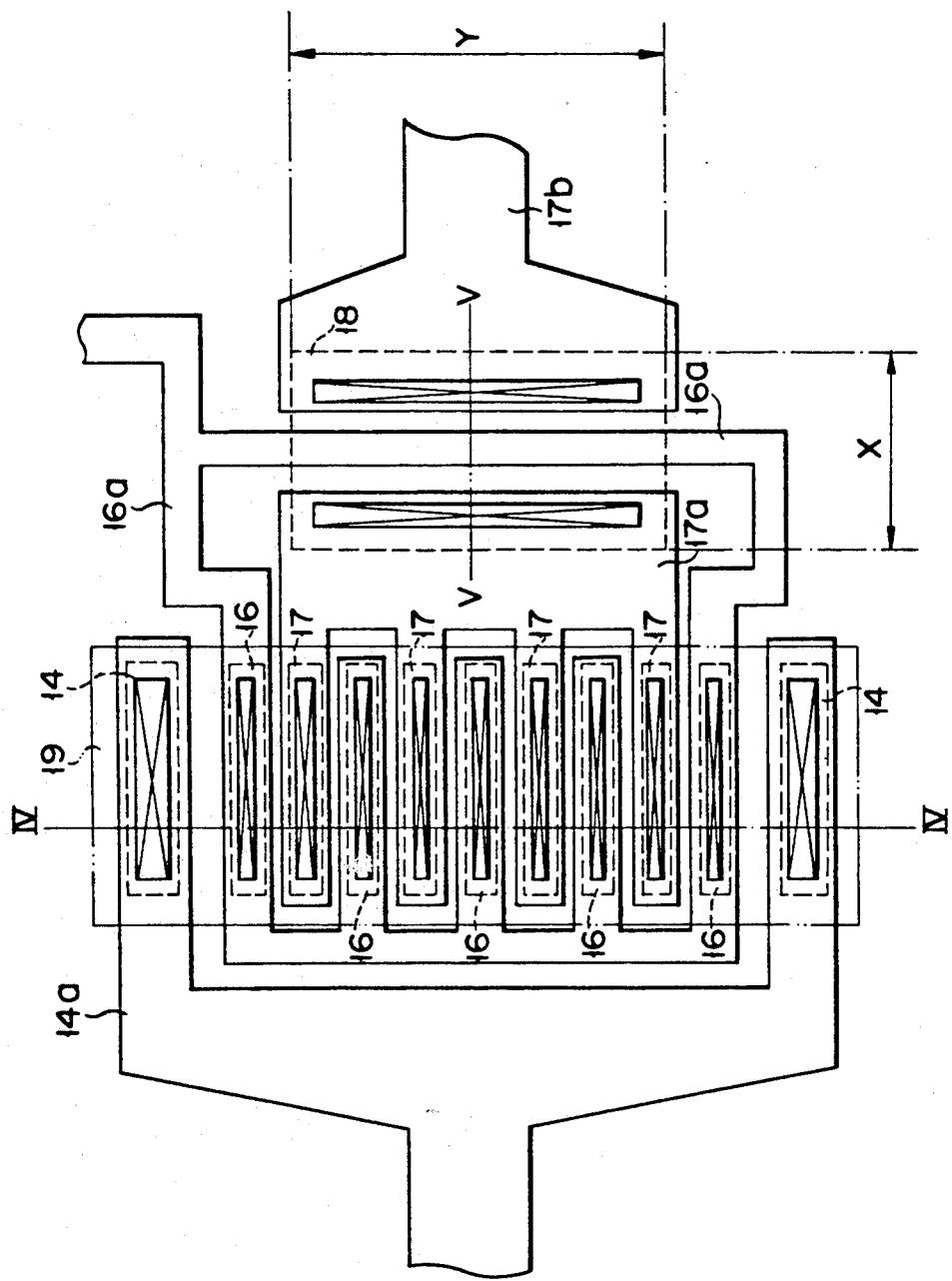
FIG. 3 is a plan view showing a pattern of a semiconductor device according to the first embodiment of the present invention.
Figure 4:
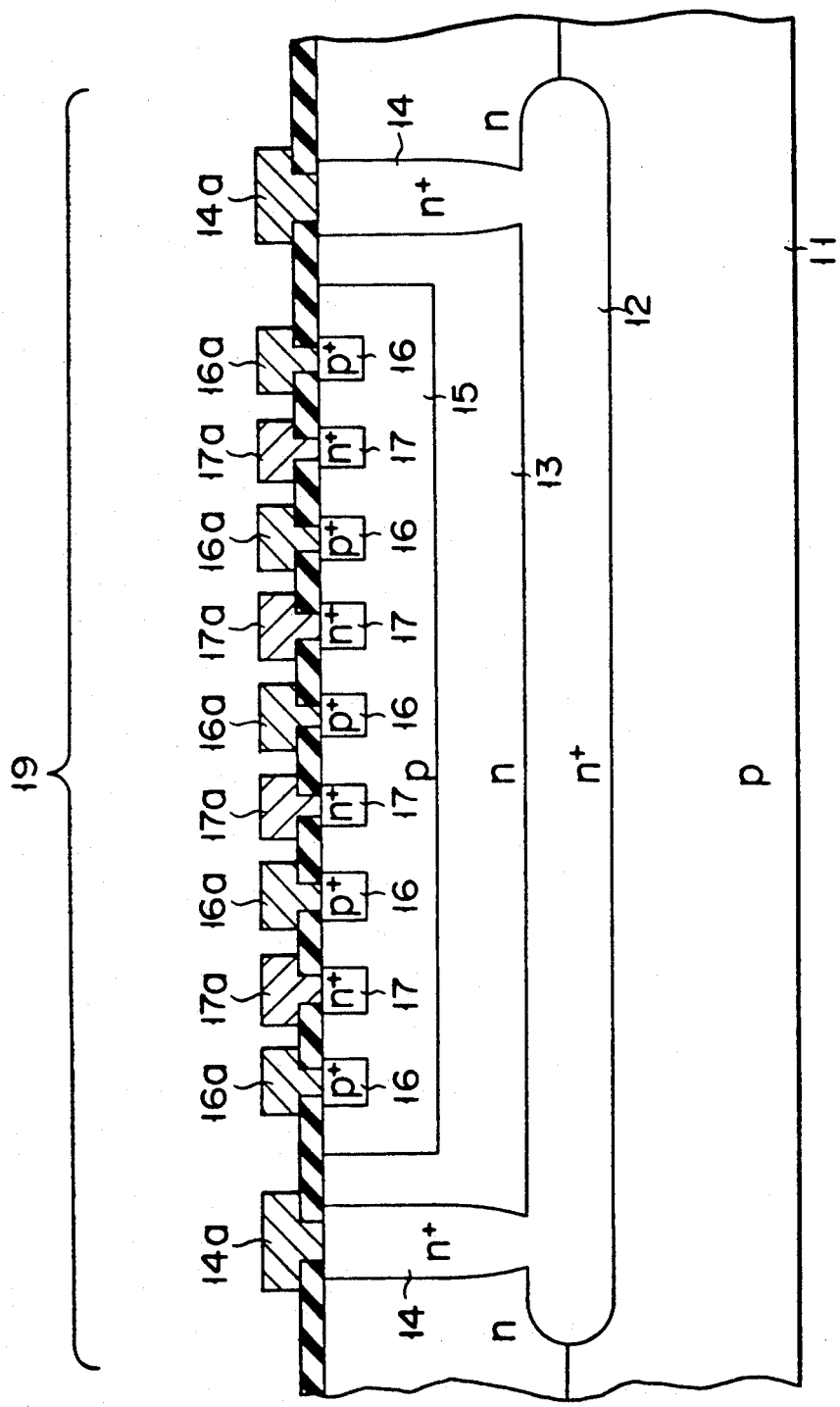
FIG. 4 is a sectional view showing the semiconductor device along a line IV—IV in FIG. 3.

FIG. 3 shows a schematic two-dimensional pattern of a semiconductor device according to the first embodiment of the present invention. FIG. 4 is a sectional view showing the semiconductor device along a line IV—IV in FIG. 3. Referring to FIGS. 3 and 4, reference numeral 11 denotes a p-type semiconductor substrate; 12, an n$^+$-type buried collector layer; 13, an n-type collector layer; 14, an n$^+$-type collector extraction layer; 14a, a collector electrode; 15, a p-type base layer; 16, a p$^+$-type base layer; 16a, a base electrode; 17, an n$^+$-type emitter layer; 17a, an emitter electrode; 17b, an external emitter electrode; 18, a resistor layer for forming an emitter; and 19, a transistor region.

The n$^+$-type buried collector layer 12 is formed in the transistor region 19 on the semiconductor substrate 11. The n$^+$-type collector extraction layer (continuous layer) 14 reaching the substrate major surface is formed at both the ends of the n$^+$-type collector layer 12. The n-type collector layer 13 is formed in a region defined by the n$^+$-type buried collector layer 12 and the n$^+$-type collector extraction layer 14. The p-type base layer (base region) 15 is formed in the surface region of the n-type collector layer 13. A plurality of p$^+$-type base layers (high-concentration base region) 16 and a plurality of p$^+$-type emitter layers (emitter region) 17 are alternately formed one by one in the surface region of the p-type base layer 15. The collector electrode 14a, the base electrode 16a, and the emitter electrode 17a are formed on the n$^+$-type collector extraction layer 14, the p$^+$-type base layer 16, and n$^+$-type emitter layer 17, respectively. The collector electrode 14a is formed on the n$^+$-type collector extraction layer 14 and extends from both ends of the transistor region 19 on each side of the transistor region 19. The extension portions are connected to each other. The collector electrode 14a forms a U-shaped pattern as a whole. The emitter electrode 17a is formed on the plurality of n$^+$-type emitter layers 17 and extends from the corresponding emitter layers 17 in the direction opposite to the extending direction of the collector electrode 14a, i.e., on a side opposite to the side of the transistor region. The extension portions of the emitter electrode 17a are connected to each other. The emitter electrode 17a forms a comb-shaped pattern as a whole. The emitter electrodes 17a are connected to the external emitter electrode 17b through the emitter resistor layer 18. The base electrode 16a is formed on the plurality of p$^+$-type base layers 16 and extends from the corresponding base layers 16 in the extending direction of the collector electrode 14a. The extension portions of the base electrode 16a are connected to each other on one side of the transistor region. The base electrode 16a also extends from both ends of the transistor region 19 on the opposite side, and these extension portions are also connected to each other. That is, the base electrode 16a extending from the end of the transistor region 19 extends on the resistor layer 18, reaches the base electrode 16a extending from the other end of the transistor region 19, and is connected to the base electrode 16a extending from the other end.

FIGS. 5 and 6 are sectional views showing the semiconductor device along a line V—V in FIG. 3.

FIG. 5 shows the emitter resistor layer 18 consisting of a polysilicon layer. When a polysilicon layer is used as a resistor, for example, arsenic-doped polysilicon having a low sheet resistance is preferably used. In this case, a length X (FIG. 3) of the emitter resistor layer 18 can be sufficiently increased, and an interval between the emitter electrodes can be obtained such that the base electrode 16a extends on the emitter resistor layer 18 to be separated from the emitter electrodes 17a and 17b having a sufficient distance. FIG. 6 shows the emitter resistor layer 18 consisting of an impurity diffusion layer. In this case, when the resistance of the resistor layer 18 is decreased, the length X of the emitter resistor layer 18 can be sufficiently increased.

A method of manufacturing the semiconductor device will be described below with reference to FIGS. 3 and 4.

By using a known method, the n$^+$-type buried collector layer 12, the n$^+$-type collector layer 13, an n$^+$-type collector extraction layer 14, the p-type base layer 15, a p$^+$-type base layer 16, and the n$^+$-type emitter layer 17 are formed in the transistor region 19 on the semiconductor substrate 11. Thereafter, a first insulating film is formed on the entire surface of the resultant structure. A pure polysilicon layer is formed on the first insulating film by a CVD (chemical vapor deposition) method to have a thickness of 5,000 Å. Phosphorus (P) ions are implanted in the polysilicon layer at a dose of about $3.5 \times 10^{15}$ [atoms/cm$^2$] and an acceleration voltage of 40

[keV] to change the polysilicon layer into a conductive polysilicon layer having a sheet resistance of about 100 [$\Omega/\square$]. The polysilicon layer is selectively photoetched to leave a polysilicon layer serving as the emitter resistor layer 18 in a stripe shape on the first insulating film on the side of the extension portion side of the emitter electrode in the transistor region. Thereafter, a second insulating film is formed on the entire surface of the resultant structure to have a thickness of about 8,000 Å. The first and second insulating films are selectively photoetched to form contact holes reaching the remaining polysilicon layer, the n+-type collector extraction layer 14, the p+-type base layer 16, and the n+-type emitter layer 17 are opened, respectively. An aluminum layer is formed on the entire surface by a CVD method and patterned to form an electrode layer and a wiring layer. At this time, the patterning for the aluminum layer is performed such that the extension portions of the base electrode 16a are connected to each other on the extension side of the collector electrode 14a from the transistor region 19 and that the extension portions extend from both the ends of the transistor region 19 on the opposite side. This patterning is performed such that extension portion of the base electrode 16a extending from the end of the transistor region 19 extends on the resistor layer 18 between the emitter electrodes 17a and 17b and is connected to the other extension portion of the base electrode 16a extending from the other end of the transistor region 19. In this case, a length X of the emitter resistor layer 18 is set to be sufficiently long, and the extension portion of the base electrode 16a can easily extend between the emitter electrodes 17a and 17b without contacting these emitter electrodes. In this case, a resistance of the emitter resistor layer 18 can be adjusted by increasing a width Y of the emitter resistor layer 18. More specifically, the length X of the resistor layer 18 consisting of the polysilicon layer must be 10 μm or more such that the base electrode 16a on the resistor layer 18 can easily extend. A resistance of the emitter resistor layer 18 is preferably about 20 $\Omega$. For this reason, the length X of the resistor layer 18 consisting of, e.g., a polysilicon layer is set to be about 20 μm, and the width Y (FIG. 3) of the resistor layer 18 is set to be 100 μm. When the resistance of the emitter resistor layer 18 must be set to be 10 $\Omega$ or less, an arsenic-doped silicon layer is used as a resistor member. In this case, the sheet resistance is to be about 30 [$\Omega/\square$], and the demand can be satisfied.

With the above arrangement according to this embodiment, the base electrode 16a extends from both ends of the transistor region 19. Even when a pitch between the p+-type base layer 16 and the n+-type emitter layer 17 is decreased to achieve an increase in high-frequency output and in high-frequency gain, a margin of a current density of the base electrode is not decreased. More specifically, conventionally, when the high-frequency output and the high-frequency gain are sufficiently increased, the base current density is to be $6 \times 10^4$ to $8 \times 10^4$ [A/cm$^2$]. According to the present invention, the base current density is decreased to be $3 \times 10^4$ to $4 \times 10^4$ [A/cm$^2$], and a decrease in margin of the current density can be prevented. In the transistor, when the decrease in margin of the current density is prevented to stably drive the base, a concentration of the collector current can be avoided. Therefore, breakdown of the transistor by Joule heat can be reduced.

Figure 7:
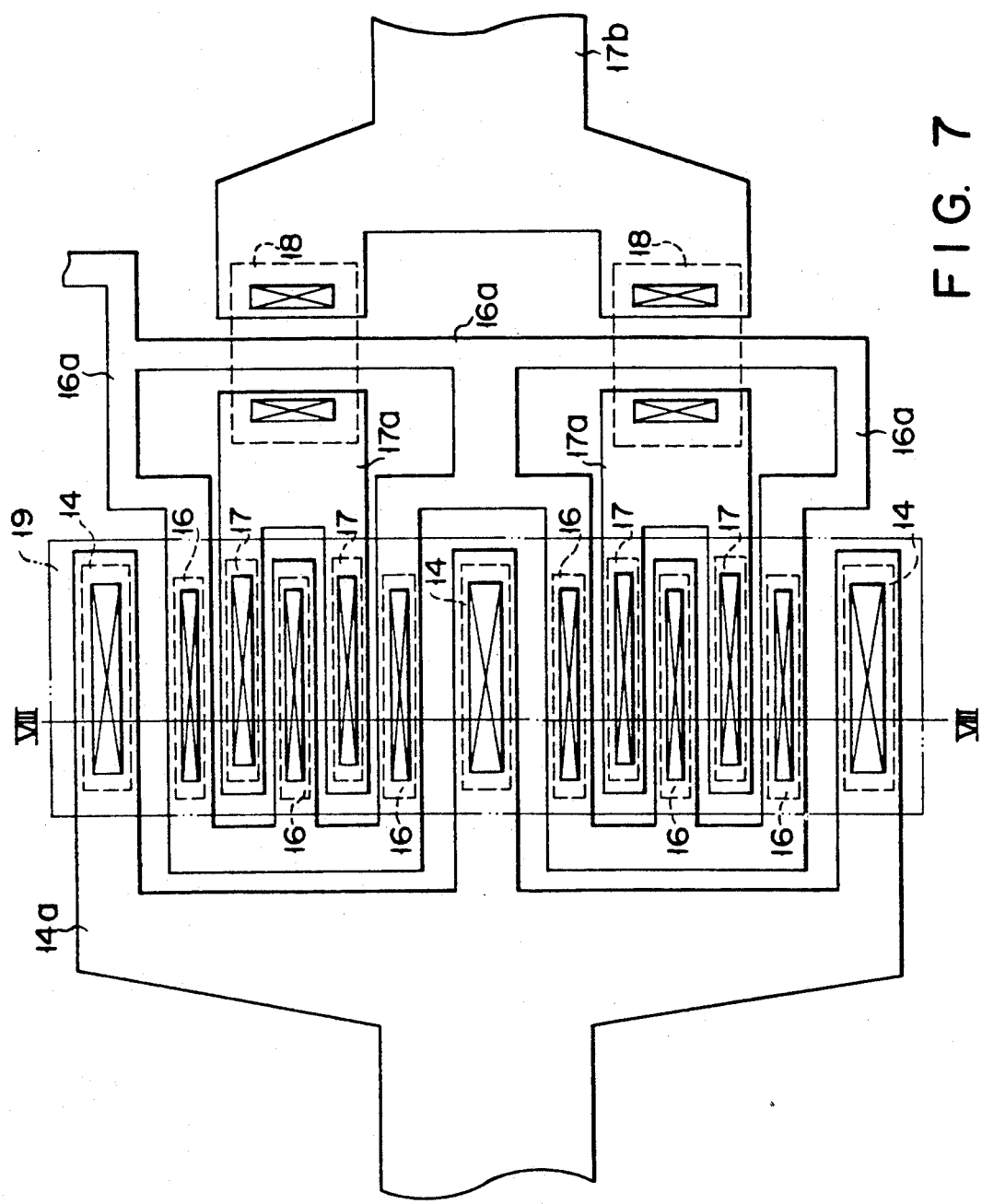
FIG. 7 is a plan view showing a pattern of a semiconductor device according to the second embodiment of the present invention.
Figure 8:
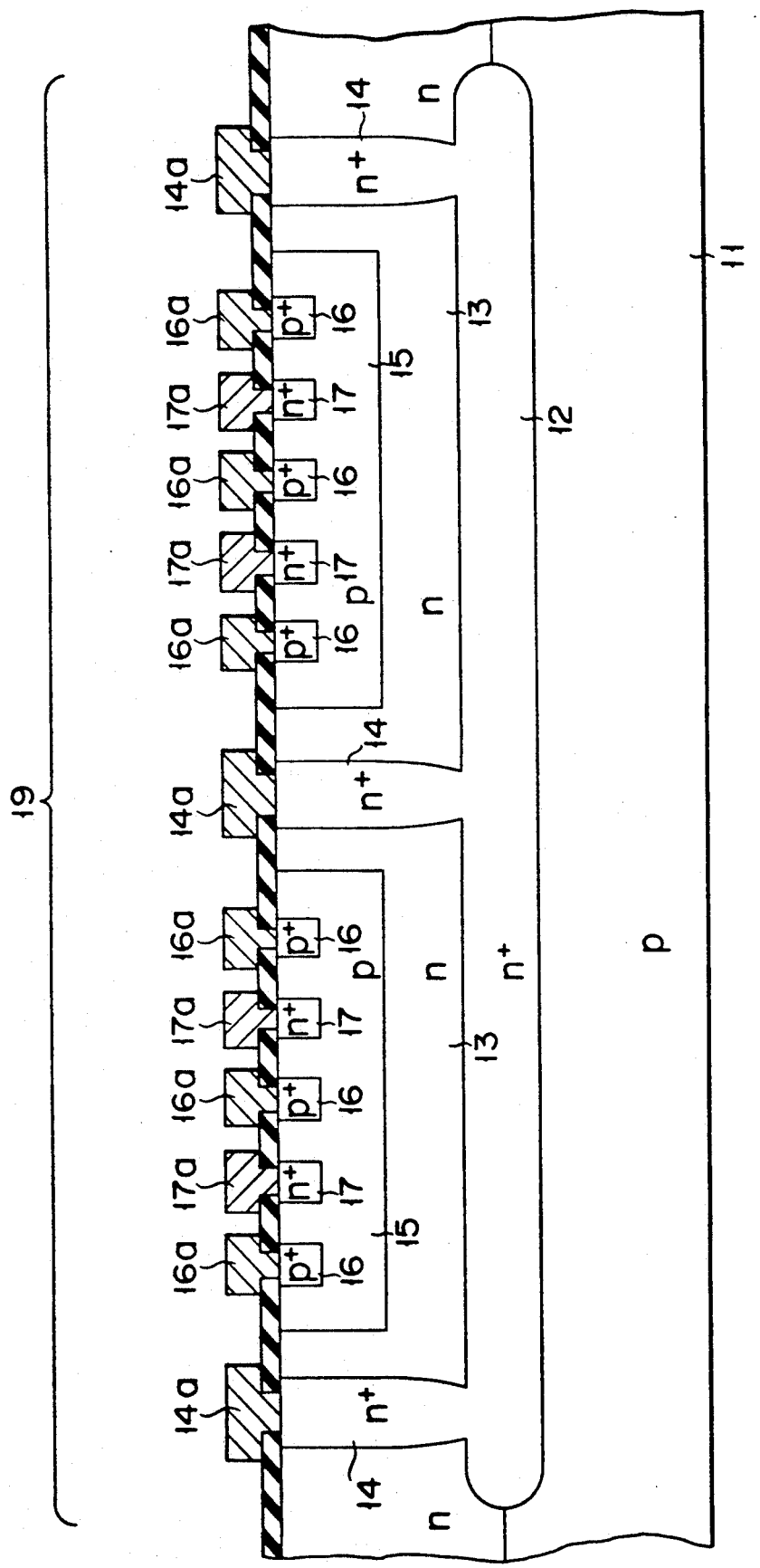
FIG. 8 is a sectional view showing a sectional view showing the semiconductor device along a line VIII—VIII in FIG. 7.

FIG. 7 shows a schematic two-dimensional pattern of a semiconductor device according to the second embodiment of the present invention. FIG. 8 is a sectional view showing the semiconductor device along a line VIII—VIII in FIG. 7.

An n+-type buried collector layer 12 is formed in a transistor region 19 on a semiconductor substrate 11. An N+-type collector extraction layer (continuous layer) 14 reaching the substrate major surface at the center and both the ends of the n+-type buried collector layer 12. N-type collector layer 13 are formed in regions respectively defined by the n+-type buried collector layer 12 and the n+-type collector extraction layer 14 located at the center and both the ends of the collector layer 12. A p-type base layer (base region) 15 is formed in the surface region of each of the n-type collector layers 13. A plurality of p+-type base layers (high-frequency base region) 16 and a plurality of n+-type emitter layers (emitter region) 17 are alternately formed one by one. A collector electrode 14a, a base electrode 16a, and emitter electrode 17a are formed on the n+-type collector extraction layer 14, the p+-type base layer 16, and the n+-type emitter layer 17, respectively. The collector electrode 14a is formed on the n+-type collector extraction layer 14 located at the center and both the ends of the transistor region 19, and the collector electrode 14a extends from the center and both the ends of the transistor region 19 on one side of the transistor region. These extension portions are connected to each other. The collector electrode 14a has an E-shaped pattern as a whole. The emitter electrodes 17a on the emitter layers 17 in each of the n-type collector layer 13 are formed on the n+-type emitter layers 17 and extend in a direction opposite to the extension direction of the collector electrode 14a, i.e., a side opposite to the side of the transistor region. The extension portions are connected to each other. The extension portions of the emitter electrode extending from the emitter layers 17 in the n-type collector layers 13 are commonly connected to the external emitter electrode 17b through the corresponding emitter layers 18. The base electrode 16a is formed on the plurality of p+-type base layers 16, and the extension portions of the base electrode 16a are connected to each other on the side of the transistor region and extend from the center and both ends of the transistor region 19 to the other side. The extension portions are connected to each other. That is, the base electrode 16a extending from the end of the transistor 19 extends on the two emitter resistor layers 18 and is connected to the extension portion of the base electrode 16a extending from the center and the other end of the transistor region 19.

According to the arrangement of the embodiment, the base electrode 16a extends from at least three portions of the transistor region 19, i.e., the center and both ends of the transistor region 19. The extension portion of the base electrode 16a extending from one end of the transistor region 19 extends on the emitter resistor layer 18 and is connected to extension portions of the base electrode 16a extending from the center and the other end of the transistor 19. Therefore, the same effect as describe din the first embodiment (FIGS. 3 and 4) can be obtained.

Figure 9:
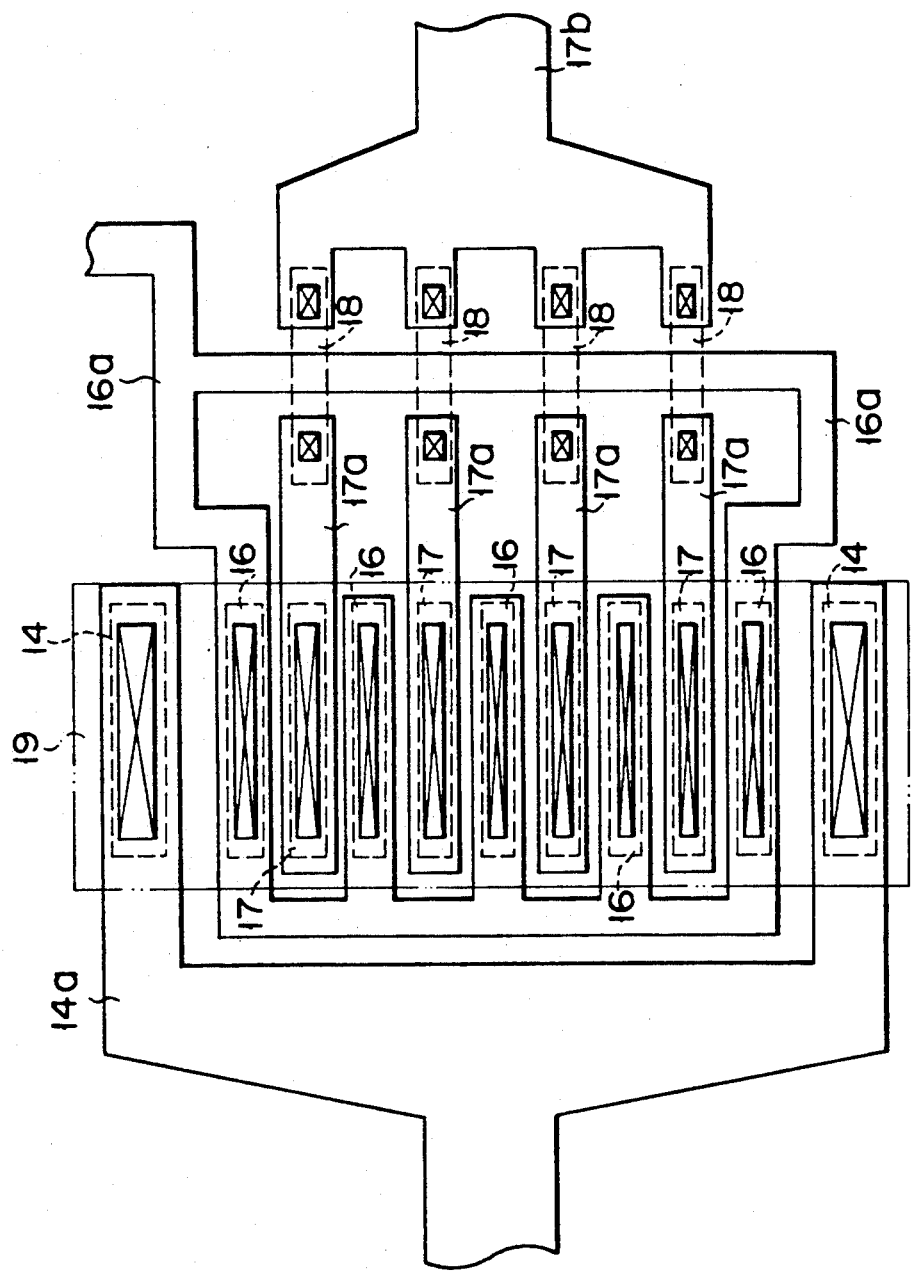
FIG. 9 is a plan view showing a pattern of a semiconductor device according to the third embodiment of the present invention.

FIG. 9 shows a schematic two-dimensional pattern of a semiconductor device according to the third embodiment of the present invention.

According to this embodiment, a plurality of emitter resistor layers 18 are formed in correspondence with a plurality of n+-type emitter layers 17, and a plurality of emitter electrodes 17a formed on the plurality of n+- type emitter layers 17 are commonly connected to an external emitter electrode 17b through the corresponding emitter resistor layers 18. In this case, an extension portion of base electrode 16a extending from one end of a transistor 19 extends on all the emitter resistor layers 18 and is connected to an extension of base electrode 16a extending from the other end of the transistor 19. Therefore, the same effect as described in the first embodiment (FIGS. 3 and 4) can be obtained. Note that, in this embodiment, since all the emitter electrodes 17a are commonly connected to the external emitter electrode 17b, no emitter electrode 17a extends on one side of the transistor region, and emitter electrodes 17a are not connected to each other on this side. The remaining description of the third embodiment is substantially the same as that of the first embodiment, and a description thereof will be omitted.

FIG. 10 shows a schematic two dimensional pattern of a semiconductor device according to the fourth embodiment of the present invention.

In this embodiment, a plurality of transistors used in the first embodiment (FIGS. 3 and 4) are formed in parallel with each other. The same effect as described in the first embodiment (FIGS. 3 and 4) can be obtained, as a matter of course.

As described above, according to the semiconductor device of the present invention, the following effect can be performed.

A base electrode formed on a plurality of p+-type base layers extends from at least two portions of a transistor region, and the extension portions are connected to each other. For this reason, even when a collector current is increased, the base resistance of the base electrode is not increased, and a stable operation can be performed. Therefore, the base of the transistor region can be stably driven, and a high-frequency output and a high-frequency gain can be increased. In addition, an increase in margin of a current density of the base electrode can be achieved.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device comprising:
   a transistor region in a semiconductor substrate;
   a collector region and a base region in said transistor region;
   a plurality of emitter regions and a plurality of high-concentration base regions alternately in said base region;
   an emitter electrode electrically connected to at least one of said emitter regions, said emitter electrode extending from a first side of said transistor region; and
   a base electrode on said plurality of high-concentration base regions, said base electrode having at least two extension portions extending from at least two portions of said transistor region from said first side of said transistor region, wherein said extension portions are connected to each other.

2. A semiconductor device according to claim 1, further comprising:
   a collector electrode on said collector region, said collector electrode having at least two extension portions extending from at least two portions of said transistor region on a second side of said transistor region opposite to said first side, and said extension portions being connected to each other;
   wherein said emitter electrode is formed on said plurality of emitter regions as a continuous layer, said emitter electrode having at least two extension portions extending from said first side of the transistor region, and wherein said extension portions of said emitter electrode are connected to each other.

3. A semiconductor device according to claim 2, wherein one of said extension portions of said base electrode extends on a resistor layer connected to said emitter electrode and is connected to another of said extension portions of said base electrode.

4. A semiconductor device according to claim 1, wherein said base electrode extends from both ends of said transistor region.

5. A semiconductor device according to claim 1, wherein said base electrode extends from both ends and a center of said transistor region.

6. A semiconductor device according to claim 3, wherein said resistor layer consists of a polysilicon layer on said substrate.

7. A semiconductor device according to claim 3, wherein said resistor layer comprises an impurity diffusion layer in said substrate.

8. A semiconductor device according to claim 1, further comprising:
   a collector electrode on said collector region, said collector electrode having at least two extension portions extending from at least tow portions of said transistor region on a second side of said transistor region opposite to said first side, and said extension portions being connected to each other;
   wherein said emitter electrode includes a first emitter electrode portion formed on a predetermined number of said plurality of emitter regions as a continuous layer, said first emitter electrode portion having at least two electrically connected extension portions each extending from said first side of said transistor region, and a second emitter electrode portion formed on the remainder of said plurality of emitter regions as a continuous layer, said second emitter electrode portion having at least two electrically connected extension portions extending from said first side of said transistor region.

9. A semiconductor device according to claim 1, further comprising:
   a collector electrode on said collector region, said collector electrode having at least two extension portions extending from at least two portions of said transistor region on a second side of said transistor region opposite to said first side, and said extension portions being connected to each other;
   a plurality of emitter electrodes independently formed on said plurality of emitter regions, said plurality of emitter electrodes extending from said first side of said transistor region, and extension portions of said plurality of emitter electrodes being connected to each other.

10. A semiconductor device according to claim 1, wherein said base electrode further includes third and fourth extension portions extending from separate portions of said transistor region and a second side of said transistor region opposite to said first side of said transistor region, wherein said third and fourth extension portions are connected to each other.

11. A semiconductor device according to claim 2, wherein said base electrode further includes third and fourth extension portions extending from separate portions of said transistor region and said second side of said transistor region, wherein said third and fourth extension portions are connected to each other.

12. A semiconductor device according to claim 8, wherein said base electrode further includes third and fourth extension portions extending from separate portions of said transistor region and said second side of said transistor region, wherein said third and fourth extension portions are connected to each other.

13. A semiconductor device according to claim 9, wherein said base electrode further includes third and fourth extension portions extending from separate portions of said transistor region and said second side of said transistor region, wherein said third and fourth extension portions are connected to each other.

* * * * *